US00H002209H

(19) United States

(12) Statutory Invention Registration

Leonhardt et al.

(10) Reg. No.: US H2209 H

(43) Published: Feb. 5, 2008

(54) LARGE AREA METALLIZATION PRETREATMENT AND SURFACE ACTIVATION SYSTEM

(75) Inventors: Darrin Leonhardt, Gaithersburg, MD (US); Scott G. Walton, Burke, VA (US); Robert A. Meger, Crofton, MD (US); Christopher Muratore, Alexandria, VA (US)

(73) Assignee: The United States of America as represented by the Secretary of the Navy, Washington, DC (US)

(21) Appl. No.: 10/825,800

(22) Filed: Apr. 14, 2004

(65) Prior Publication Data

US 2005/0230242 A1 Oct. 20, 2005

(51) Int. Cl.
*C23C 14/32* (2006.01)

(52) U.S. Cl. ..... 204/192.11; 204/192.32

(58) Field of Classification Search ..... 204/298.04, 204/298.16, 298.06, 298.24, 192.11, 192.12; 250/492.3; 315/111.21, 111.71, 111.81; 118/724, 118/723 EB; 427/554, 557, 595

See application file for complete search history.

(56) References Cited

U.S. PATENT DOCUMENTS

| | | | | |
|---|---|---|---|---|
| 3,393,142 A | | 7/1968 | Moseson | |
| 3,436,332 A | | 4/1969 | Oda | |
| 4,336,277 A | | 6/1982 | Bunshah | |
| 4,509,451 A | * | 4/1985 | Collins et al. | 118/50.1 |
| 5,089,066 A | * | 2/1992 | Hamada et al. | 148/302 |
| 5,178,739 A | * | 1/1993 | Barnes et al. | 204/192.12 |
| 5,182,496 A | | 1/1993 | Manheimer et al. | 315/111.41 |
| 5,874,807 A | | 2/1999 | Neger et al. | 315/111.41 |
| 6,416,635 B1 | | 7/2002 | Hurwitt | |

OTHER PUBLICATIONS

Meager et al, Beam generated plasma for processing applications, Physics of Plasmas, vol. 8, No. 5, May 2001, pp. 2558–2564.

U.S. Appl. No. 10/644,567 entitled "Electron Beam Enhanced Large Area Deposition System" filed Aug. 20, 2003 by Scott G. Walton et al.

U.S. Appl. No. 10/672,269 entitled "Method and Apparatus for Producing an Ion–Ion Plasma Continuous in Time" filed Sep. 26, 2003 by Richard F. Fernsler et al.

R. F. Fernsler et al., "Production of large–area plasmas by electron beams," Phys. Plasmas, 1998, 5, 2137–2143.

Wallace M. Manheimer et al., "Theoretical overview of the large–area plasma processing system (LAPPS)," Plasma Sources Sci. Technol. 2000, 9, 370–386.

(Continued)

*Primary Examiner*—Michael J. Carone

(74) *Attorney, Agent, or Firm*—John J. Karasek; Stephen T. Hunnius

(57) ABSTRACT

A large area metallization pretreatment and surface activation system that uses an electron beam-produced plasma capable of delivering substantial ion and radical fluxes at low temperatures over large areas of an organic plastic or polymer material. The ion and radical fluxes physically and chemically alter the surface structure of the organic plastic or polymer material thereby improving the ability of a film to adhere to the material.

36 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

OTHER PUBLICATIONS

S. G. Walton et al., "Ion energy distributions in a pulsed, electrom beam–generated plasma," J. Vac. Sci. Technol. A, 2001, 19(4), 1325–1329.

D. Leonhardt et al., "Plasma diagnostics in large area plasma processing system," J. Vac. Sci. Technol. A, 2001, 19(4), 1367–1373.

R. A. Meger et al., "Beam–generated plasmas for processing applications," Phys Plasmas, 2001, 8, 2558–2564.

Darrin Leonhardt, "Electron–Beam Produced Plasmas: Considerations and Applications, " Vacuum Technology & Coating, Nov. 2001, 24–35.

D. Leonhardt et al., "Generation of electron–beam produced plasmas and applications to surface modification," Surface and Coatings Technology, 2004, 177–178, 682–687.

* cited by examiner

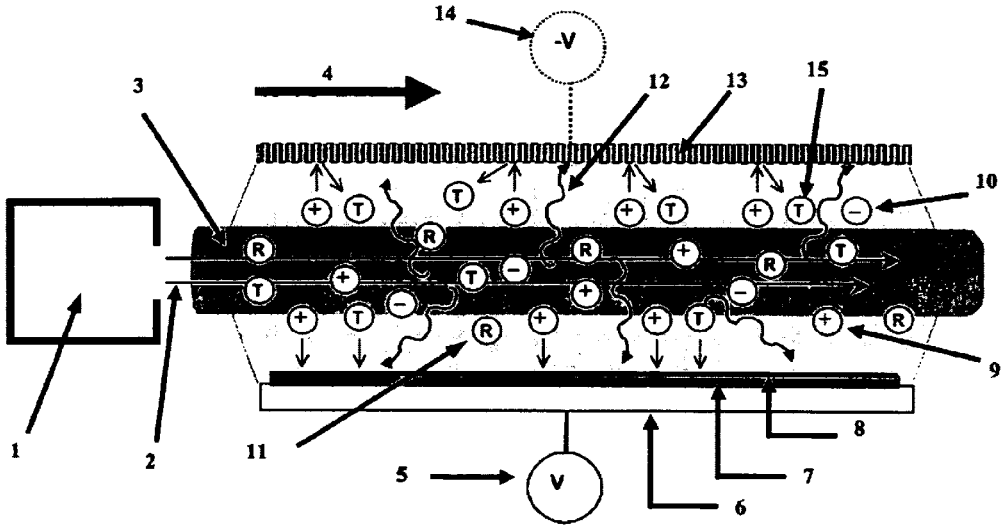

Figure 1. LAMPSAS Schematic I: (1) Beam source; (2) Electron beam; (3) Beam-generated plasma; (4) Direction of external magnetic field; (5) Substrate bias voltage (+ or -); (6) Conducting electrode; (7) Substrate; (8) Deposited film; (9) Positive ion; (10) Electron and/or negative ion; (11) Neutral radical; (12) UV photon; (13) Target; (14) Target power supply; and (15) Sputtered target material. The width of the substrate goes into the page.

Figure 2 Photograph of inside of chamber with a) substrate holder, b) anode slot for electron beam source, and c) magnetron with aluminum target.
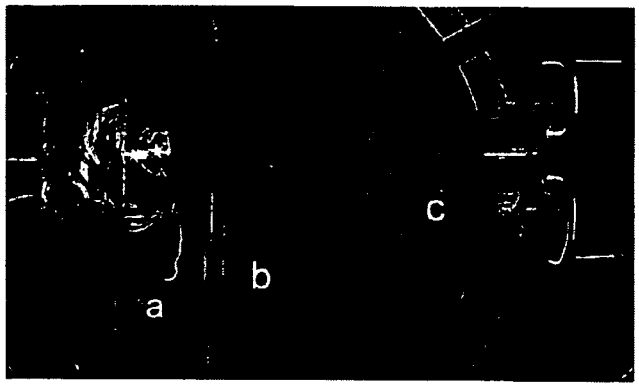

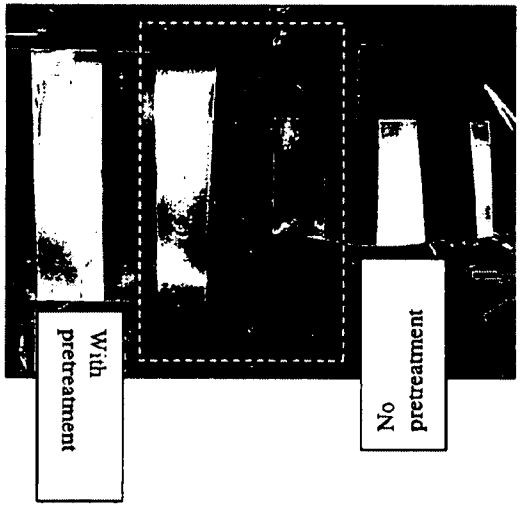
Figure 3 Aluminum-coated Teflon® samples without (top) and with (bottom) plasma pretreatment. The dotted line shows where the tape was applied for the Scotch® tape adhesion test.

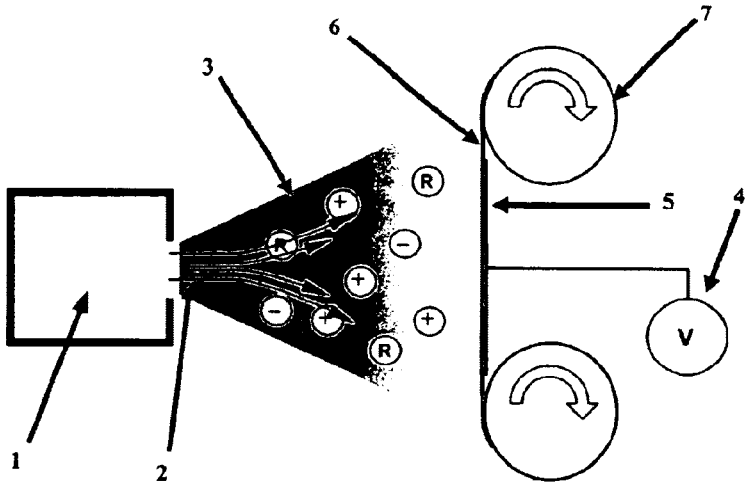
Figure 4. LAMPSAS Schematic II: (1) Beam source; (2) Electron beam; (3) Beam-generated plasma; (4) Substrate bias voltage (+ or -); (5) Conducting electrode; (6) Substrate; and (7) roll-to-roll spools for substrate. The width of the system goes into the page. Gas phase species are not labeled here for clarity.

LARGE AREA METALLIZATION PRETREATMENT AND SURFACE ACTIVATION SYSTEM

BACKGROUND

1. Field of the Invention

The present invention relates to surface pretreatments and, more specifically, to a system for pretreating large-area plastics and similar materials to improve adhesion properties of coatings.

2. Description of the Related Art

There are numerous methods used to activate or pretreat plastics (e.g. polymers) to improve the adhesion of coatings such as metals. One of the simplest and most effective methods is to roughen the surface by sandblasting, grinding, or chemically etching to increase the contact area of the surface. Chemical etching is particularly attractive because it provides selectivity over various polymer phases; however, the handling of the hazardous chemicals typically used in this approach is undesirable. Other techniques to enhance adhesion of polymers are flame treatment, corona discharge and low pressure plasma activation. All of these pretreatment techniques are plasma-based and form a broad variety of oxygen containing functional groups on the polymer surface. During such treatments, the near-surface layer can also be cross-linked by the ultraviolet (UV) radiation emitted by the plasma, which degrades the polymer surface and in turn decreases the surface adhesion capabilities.

The surface chemistry of polymers is very important in their adhesion properties; hence, plasma treatments, which offer a broader range of reactions, have been used in industry and research. Generally, adhesion can be greatly altered by certain functional groups on particular material surfaces. For instance, the adhesion of aluminum to polyester (PET) is due to the inherent ether (C═O) groups which in turn form metal oxide (C—O—Al) bonds. The number of these metal oxide bonds can be increased by surface oxidation via plasma treatment, and thus increase the strength of the Al/PET interface. However, the same PET substrate becomes extremely hydrophobic (water-repellant) due to the increased polarity of the additional surface moieties (functional or radical groups) and the micro-roughening (etching) produced by the plasma. The balance between these properties comes from the ability to control the pretreatment process in order to achieve the desired outcome. As another example, to 'metallize' a non-oxygen containing material, a plasma pretreatment containing oxygen may be used to produce radical species, which activate and also react with (e.g. oxidize) the surface. The metal adhesion is similarly increased through metal oxide bonds. If the surface is to be prepared for a different treatment, the plasma parameters can be adjusted during the pretreatment to produce increased surface roughening (e.g. sputtering by plasma ions), different surface moieties (e.g. plasma production of different radical and ion species) or cross-linking (e.g. various UV light exposure).

Various plasma sources have been used to demonstrate changes in plastic and polymer surface structure and the effects of plasma processing on the adhesion coatings. Most of these systems have been very simple arrangements that consisted of rf and dc glow discharges. The shortcoming of such systems has been (1) the inability to control plasma species and thus target specific surface reactions, (2) excessive substrate heating by the plasma source, which can be detrimental to many materials, and (3) over exposure of UV radiation from the plasma source. Furthermore, scaling up to large processing areas (e.g. >1 $m^2$) while retaining process uniformity and quality is not necessarily achievable.

SUMMARY

The aforementioned problems of the current technology are overcome by the present invention wherein an electron beam-produced plasma delivers a substantial ion and radical flux at a low temperature over a large area to chemically and physically alter the surface of a substrate thereby improving the ability of a film to adhere to the substrate. This invention provides a means to pretreat large-area plastics and similar materials to improve adhesion properties of metallic and non-metallic coatings. Primary industrial applications requiring pretreatments include, for example, diffusion barrier coatings, decorative coatings, electromagnetic interference shielding, electronic components, or wear resistant coatings. More specialized applications consist of, for example, optical coatings, solar radiators, and reflectors. While all of these applications consist of a thin metallic film on a plastic surface, each has a different chemical structure and, therefore, different interfacial structure. Similarly, inorganic and organic non-metallic coatings rely on the surface's properties for improved adhesion and, therefore, performance. Applications of non-metallic coatings include, for example, dielectrics as an optical coating and biocompatible materials for non-fouling surfaces and bio-agent sensors.

The present invention utilizes an electron beam-produced plasma capable of delivering substantial ion and radical fluxes at low temperatures over large areas. The combination of these chemically reactive species to the surface of the organic plastic (or polymer) material alters the surface structure chemically and physically, thereby improving the adhesion of films. The electron-beam-produced plasma allows greater control over the relative radical and ion fluxes, thereby permitting a large process space and the ability to treat a wide variety of substrates. Further, the system can be configured with an independent sputter source. The sputter source can be of commercial design or as described in U.S. patent application Ser. No. 10/644,567 entitled "Electron Beam Enhanced Large Area Deposition System" filed on Aug. 20, 2003 by Scott Walton et al., which is incorporated herein by reference. In this configuration, the electron beam-produced plasma could be operating in a process gas to promote the desired surface pretreatment of the plastic substrate (i.e. make a more reactive surface). The sputter source would then be run with an inert process gas to deposit metal material onto the pretreated surface. This all-in-one system would allow both the plasma pretreatment and deposition, without transferal of the substrate into other vacuum systems. Regardless of the presence or use of a deposition source, the large area metallization pretreatment and surface activation system (LAMPSAS) of the present invention offers a new approach to surface preparation prior to deposition on plastic substrates.

Over the last few years, the Charged Particle Physics Branch (Code 6750) at the Naval Research Laboratory (NRL) has developed a new plasma source called the Large Area Plasma Processing System (LAPPS). See U.S. Pat. No. 5,182,496 to Manheimer et al.; U.S. Pat. No. 5,874,807 to Neger et al.; Physics of Plasmas, 5(5), 2137–2143, 1998; Plasma Sources Sci. Technol., 9, 370–386, 2000; Journal of Vacuum Science and Technology A, 19(4), 1325–1329, 2001; Journal of Vacuum Science and Technology A, 19(4), 1367–1373, 2001; and Physics of Plasmas, 8(5), 2558–2564, 2001, all of which are incorporated herein by reference. This system uses a magnetically confined sheet electron beam to ionize a background gas and produce a planar plasma. Electron beams exhibit high ionization and dissociation efficiency and the ionization process (plasma production) is decoupled from the gas constituents and reactor geometry. Since the plasma volume is limited only by the beam dimensions, the usable surface area of these plasmas can significantly exceed that of other plasma sources. At NRL, rectangular plasmas with a thickness of 1 cm and an area of 1 $m^2$ have been produced.

Plasmas produced in this manner possess the desired characteristics discussed previously for a plasma pretreatment tool. The process gas mixture and plasma-to-substrate separation tightly control radical and ion flux, while process uniformity is maintained over large surface areas. Ion energies are inherently low (<5 eV), thus favoring predominantly chemical surface processes, while processes requiring higher energies (i.e., an etch component) can be achieved by applying an external bias to the substrate. This ultimate control over the ion energies (from one to hundreds of electron-volts (eV)) is not present in current plasma pretreatment systems. In fact, for most systems, the inability to prevent high ion energies often leads to undesirable heating and ion damage of delicate substrates. Furthermore, due to the beam-ionization mechanism, fewer excited states exist in the plasma species, which reduces UV emissions from the source. Therefore, a process where polymer cross-linking is undesirable (i.e., metallization) will be better optimized; for a process requiring UV activation, longer process times can be used without additional ion damage since the ion energies are inherently low. This combination of features and the ability to scale to large areas adds a range of control variables that would enable the system to access operating regimes not possible with conventional treatment technologies.

Electron beam-produced plasmas are attractive for the pretreatment of various polymer materials and can be utilized separately or in conjunction with traditional plasma vapor deposition (PVD) tools. For instance, after pretreatment, LAPPS can then be an ion source for the sputter deposition of the final coating. Alternatively, a separate PVD technology, such as sputter sources or evaporation techniques, can be added to apply the final coating. In either configuration, electron beam-produced plasmas offer higher uniformity, efficiency, and controllable chemistries relative to conventional sources.

The present invention has several advantages over existing technology because of the unique properties of electron beam generated plasmas. In particular, the source improves the efficiency and uniformity in plasma production, provides greater control over plasma production, expands the ability to control the particle fluxes at surfaces, and offers new and alternative chemical pathways to enhance or produce new chemical surface pretreatments. Furthermore, it can be implemented as a stand-alone system or into a pre-existing vacuum coating system.

Consider first the ability to regulate the concentrations of plasma species. In conventional sources, gas ionization and dissociation favors the species with the lowest ionization and dissociation energies and thus these sources provide little control over the relative concentrations of plasma species. High-energy electron beams, which are above the threshold energies for ionization and dissociation, interact with all gases equally and create plasma species (ion and radical) roughly in proportion to the relative gas concentrations. The resulting production and thus concentration of species is markedly different than other plasma sources, and allows for a unique set of gas phase and surface chemistries. The beam current, operating pressure, and gas mixture ratios determine the total and relative production rates. These variables allow for control over the production of ion and radical species and ultimately over the flux of these species at the substrate.

Control over the flux of plasma species is further enhanced due to the fact that plasma production is essentially decoupled from reactor geometry so that the target and/or substrate can be independently located. In electron beam-generated plasmas, the ionization region is confined to the beam volume and because the beam can be collimated by a magnetic field, the plasma production volume can be well defined and localized. The electron beam can be positioned at a variable distance from a substrate surface. Increasing the plasma-to-substrate distances decreases the ion flux while having little effect on the neutral fluxes. For gases like $O_2$ and $N_2$, the relative flux of molecular ions, atomic ions, and radicals will vary strongly with distance. In fact, for larger distances, the flux will consist of almost exclusively atomic ions and radicals. This is in contrast to many conventional sources where the ionization can occur over the entire chamber volume so controlling the relative fluxes at surfaces can be difficult. Furthermore, since low energy processes are not strongly driven, the production of excited atoms and molecules is decreased and the flux of UV radiation is low from electron beam-produced plasmas. Therefore it is possible to treat UV sensitive materials for an extended period of time.

Another advantage of electron beam-produced plasmas is the inherently low plasma electron temperatures. The electron temperature governs both the plasma chemistry and the energies at which ions impact surfaces and in electron beam-generated plasmas produced in molecular gases, the electron temperature rarely exceeds 1 eV. In other sources, the electron temperature ranges from between 5 and 10 eV. The benefit of the reduced energies is twofold. First, sputtering and/or ion-produced damage of the substrate is greatly diminished since the incoming ion energies are usually below the surface binding energies of most species. This allows for the treatment of sensitive substrates without unnecessary physical damage, particularly for materials that require a long process time (i.e. for long UV exposure). For processes requiring higher energies, an additional bias may be applied to the substrate with an external power supply to increase the incident ion energy. However, the variation in the incident ion energy about the applied bias will be small (typically a few eV) because the electron temperature is low and thus processes utilizing ion energy can be well controlled. Second, a global low electron temperature reduces the rates at which unwanted changes in plasma chemistry occur. This predictability of the operating conditions available provides a versatile system and allows for better optimization of specific processes.

There is no fundamental limit on the physical dimensions of the electron beam while the efficiency and uniformity in plasma production remain constant over the beam volume. With other plasma sources, scaling to large areas and maintaining uniformity over the plasma volume is difficult, and so using the electron beam-produced plasmas offers a distinct advantage. Scaling up in length and width is straightforward. The cross-section of the beam (width and thickness) is determined by the electron beam source while the length of the beam varies with both beam energy and gas pressure. At NRL, plasma sheets with surface areas from 100's to over 10,000 $cm^2$ have been produced in a variety of gases. The effective processing area is nearly identical to the plasma surface area. Uniform, large area plasma sources can be utilized in all facets of the surface pretreatment/treatment system: a large surface can be chemically activated and the top thin film applied without ever exposing the substrate to the atmosphere. The inherent scalability and uniformity are similarly attractive when combining electron beam sources with existing deposition technologies.

BRIEF DESCRIPTION OF THE DRAWINGS

These and other objects, features, and advantages of the invention, as well as the invention itself, will become better understood by reference to the following detailed description, appended claims, and accompanying drawings where:

FIG. 1 shows a schematic of a LAMPSAS configuration that can be used as a stand-alone pretreatment and deposition system;

FIG. 2 shows a LAMPSAS configuration that combines an electron beam plasma pretreatment source with an independent PVD technology where the electron beam-produced plasma is located between the PVD source and the substrate;

FIG. 3 shows a comparison between aluminum film adhesion with and without plasma pretreatment; and FIG. 4 shows a schematic of a LAMPSAS configuration that uses a non-collimated e-beam source with a roll-to-roll substrate.

DETAILED DESCRIPTION OF THE PREFERRED EMBODIMENTS

A preferred embodiment of the Large Area Metallization Pretreatment and Surface Activation System (LAMPSAS) of the present invention is shown in FIG. 1. The LAMPSAS schematic in FIG. 1 includes a beam source 1, and electron beam 2, a beam-generated plasma 3, a direction of external magnetic field 4, a substrate bias voltage (+ or −) 5, a conducting electrode 6, a substrate 7, a deposited film 8, a positive ion 9, an electron and/or negative ion 10, a neutral radical 11, a UV photon 12, a target 13, a target power supply 14, and a sputtered target material 15. LAMPSAS uses a magnetically confined, sheet electron beam to ionize and dissociate a background gas. The electron beam energy is nominally a few kiloelectron volts (keV) or less with beam current densities ranging from 0.1 to 10 mA/cm$^2$ over the cross-section of the beam. The beam width is variable and can exceed a meter. The thickness is up to a few centimeters and is maintained over the beam length by an axial magnetic field that exceeds 100 Gauss. The length of the plasma sheet is determined by the range of the electron beam, and scales with the beam energy and gas pressure. The range is usually maintained at several times the system length to ensure uniformity in plasma production. The gas pressure typically lies between 10 and 100 mTorr. For the parameters outlined, the beam range is greater than 1 m and the plasma densities are as high as ~$10^{12}$ cm$^{-3}$. Thus, LAMPSAS is capable of treating substrates exceeding 1 m$^2$. LAMPSAS is optimized for the production of chemically active surfaces to increase the adhesion of the final surface layer.

Electron beam-produced plasmas are characterized by low electron temperatures, with energies extending from a few tenths of an eV in molecular gases to about one eV in noble gases. The plasma potential is approximately five times the electron temperature and so the plasma potential extends up to 5 or 6 volts, depending on the electron temperature. Ions incident on an unbiased surface will impact with energies up to a few eV. For a plasma density of $10^{11}$ cm$^{-3}$, the flux of ions at a surface will be on the order of $10^{16}$ cm$^{-2}$s$^{-1}$. Furthermore, the plasma density is uniform over the electron beam volume resulting in a uniform flux that is deliverable over areas exceeding a square meter.

LAMPSAS can be operated in multiple configurations. In the simplest configuration, only the pretreatment or activation step would be carried out, leaving the film deposition optional. The beam-generated plasma is used with an appropriate reactive gas mixture (molecular and/or atomic gases) for the desired surface pretreatment method. For instance, a gas mixture containing oxygen would be used to oxidize a polymer surface, or nitrogen for nitration. (Similarly, halogen gases may be used; a gas of low toxicity such as sulfur hexafluoride or carbon tetrachloride could be used to fluorinate or chlorinate surfaces, respectively.) In the complete configuration, it can be used as a stand-along pretreatment and deposition system as shown in FIG. 1. In this configuration, only the electron beam-produced plasma is necessary for both the pretreatment step and the film deposition. After the pretreatment step, the electron beam-generated plasma is used with a different less reactive gas such as argon (or possibly a mixture of gases), which serves as the ion source to sputter material from the opposing target thereby producing the final coating on the pretreated surface. Since ions diffuse out of the plasma and impact the target with low energies in the absence of any bias, the target must be biased with either a dc or rf voltage in order to increase the ion energies above the target-sputtering threshold. With the plasma sheet located between the target and the substrate, the locations of each can be adjusted during either step of the process to control the flux of ions, radicals and target material reaching the substrate. Typically for pretreatment, molecular gases are chosen to produce specific radical species and noble gases are chosen for the sputter deposition step. However, sputter deposition with mixtures containing molecular gases (reactive sputter deposition) is also viable.

A third configuration combines the electron beam plasma pretreatment source with an independent PVD technology where the electron beam-produced plasma is located between the PVD source and the substrate. In this configuration, the two systems operate independently; the e-beam produced plasma pretreatment followed by the PVD of the final surface material. Such a system was constructed as a test of these concepts and is shown in FIG. 2, which is a picture of the inside of the chamber with (a) a substrate holder, (b) an anode slot for electron beam source, and (c) a magnetron with aluminum target. This is an end-on photograph of the system; therefore, the electron beam sheet came out of the page through slot (b). The chemical system chosen for this test was a Teflon® substrate that was to be coated with a thin layer of aluminum. Thin (70 micron) Teflon® pieces roughly 2×2 cm$^2$ were masked with 5 mm wide Kapton® tape and mounted to a grounded processing stage (a), which was approximately 1 cm from the electron beam edge. A sputter magnetron source with a 3 cm aluminum target was located 13 cm from the Teflon® substrate, on the other side of the electron beam-produced plasma. Hence, the relative position of the beam, aluminum target and substrate were independently set but not optimized for this proof-of-concept test. Samples were ultrasonically cleaned in methanol for 15 minutes then dried in air before being mounted in vacuum. A base vacuum of $<10^{-5}$ torr was achieved before all process tests. Aluminum films were deposited with the magnetron operation at 100 watts of power in 18 mTorr argon.

Plasma pretreatment consisted of operating the electron beam at 2000 eV with 2 ms pulse length and 20% duty factor in 50 mtorr oxygen for 10 minutes of exposure time (over 50 minutes of elapsed time). Comparisons between the aluminum film adhesion with and without plasma pretreatment were carried out through visual inspection and the AIMCAL "Scotch® Tape Test" (see "AIMCAL Procedure for Qualitatively Determining Metal Adhesion, TP-104-84," *Association of Industrial Metallizers, Coaters and Laminators (AIMCAL) Metallizing Technical Reference,* 3rd ed., edited by Eldrige M. Mount II, (August 2001), incorporated herein by reference), which qualitatively tests film adhesion by applying and removing Scotch® tape. Results of these tests are shown in FIG. 3, which shows aluminum-coated Teflon® samples without (top) and with (bottom) plasma pretreatment. The dotted line shows where the tape was applied for the Scotch® tape adhesion test. The sample edges closest to one another were the areas where the Scotch® Tape Test was carried out. The top sample, which did not undergo any plasma pretreatment, showed a weak adhesion of the deposited aluminum film, while the pretreated sample (bottom) demonstrated much greater adhesion. In fact, the aluminum film on the pretreated sample showed no peeling or separation from the substrate where the tape was applied. These results clearly demonstrate the validity of the LAMPSAS concept.

Depending on the desired process, sputtering, evaporation and chemical vapor deposition (CVD) sources can be used to deposit the final film. The number of sources (and source material) may also vary. Sputtering sources include systems such as magnetrons and ion beams. Electron beams, lasers, and thermal means can be employed to evaporate material into the gas phase. Non-metallic coatings can be deposited in a similar fashion, or by other means.

For the treatment of substantial quantities of flexible substrates, a roll-to-roll system may be implemented to feed long lengths of material through the system in any of these configurations. Furthermore, the electron beam-generated plasma could be produced using a simpler electron beam source, without the beam-collimating magnetic field. In such an arrangement, the electron beam is directed at the substrate and can be produced using the same electron beam source. The source can be stationary or mobile. FIG. 4 shows the concept of a non-collimated e-beam source with a roll-to-roll substrate. The LAMPSAS schematic in FIG. 4 includes a beam source, an electron beam, a beam-generated plasma, a substrate bias voltage (+ or −), a conducting electrode, a substrate, and roll-to-roll spools for the substrate. The width of the system goes into the page. For clarity, gas phase species are not labeled.

The above description is that of a preferred embodiment of the invention. Various modifications and variations are possible in light of the above teachings. It is therefore to be understood that, within the scope of the appended claims, the invention may be practiced otherwise than as specifically described. Any reference to claim elements in the singular, e.g. using the articles "a," "an," "the," or "said" is not construed as limiting the element to the singular.

What is claimed:

1. A large area metallization pretreatment and surface activation system, consisting of:

(a) a gas or gas mixture;

(b) an electron beam source;

(c) a low electron plasma of pre-determined width, length, thickness, and location relative to a surface, wherein a plasma sheet is produced by the electron beam passing through the gas or gas mixture;

(d) a substrate to be treated;

wherein a radical and ion flux from the plasma is controlled to chemically and physically alter the surface of the substrate thereby improving the ability of a film to adhere to the substrate;

wherein the radical and ion flux from the plasma is controlled by selecting an appropriate gas mixture based on the desired surface pretreatment and by altering the separation between the plasma sheet and the substrate.

2. The system of claim 1, wherein said electron beam source has a width much larger in dimension than its thickness.

3. The system of claim 1, wherein the electron beam is confined to produce a geometrically well-defined, spatially uniform plasma sheet.

4. The system of claim 1, wherein the relative position of said electron beam, plasma, and substrate is adjustable.

5. The system of claim 1, wherein said substrate is electrically biased.

6. The system of claim 1, wherein said gas or gas mixture comprises at least one molecular gas chosen to produce a specific radical species.

7. The system of claim 1, utilizing roll-to-roll spools to feed the substrate.

8. A large area metallization pretreatment and surface activation system, consisting of:

(a) a gas or gas mixture;

(b) an electrom beam source;

(c) a low electron plasma of pre-determined width, length, thickness, and location relative to a surface, wherein a plasma sheet is produced by the electron beam passing through the gas or gas mixture;

(d) a substrate to be treated;

wherein a radical and ion flux from the plasma is controlled to chemically and physically alter the surface of the substrate thereby improving the ability of a film to adhere to the substrate;

wherein the radical and ion flux from the plasma is controlled by selecting an appropriate gas mixture based on the desired surface pretreatment and by altering the separation between the plasma sheet and the substrate;

(e) a second gas or gas mixture; and (f) a target comprising a material source for thin films or coatings wherein plasma is used with the second gas or gas mixture to sputter material from the target and deposit as a thin film or coating the sputtered material onto the pretreated substrate.

9. The system of claim 8, wherein said target is electrically biased above a sputtering threshold for said material source.

10. The system of claim 8, wherein said electron beam and said plasma are located between the target and the substrate.

11. The system of claim 8, wherein the relative position of said electron beam, plasma, target, and substrate is adjustable.

12. The system of claim 8, wherein said second gas is selected from the group consisting of atomic or molecular gases or mixtures thereof.

13. The system of claim 8, utilizing roll-to-roll spools to feed the substrate.

14. The system of claim 1, utilizing a conventional plasma vapor deposition system for generating material for coating or deposition on the pretreated substrate, said material being generated from a material source by sputtering means or vaporization means.

15. The system of claim 14, wherein said sputtering means is selected from the group consisting of magnetrons and ion beams.

16. The system of claim 14, wherein, said vaporization means is selected from the group consisting of electron beams, lasers, and thermal sources.

17. The system of claim 14, wherein said electron beam and said plasma are located between said source material and said substrate.

18. The system of claim 14, wherein the relative position of said electron beam, plasma, source material, and substrate is adjustable.

19. A method of producing a chemically active surface to improve the ability of a film to adhere to a substrate, consisting of the steps of:

(a) producing a low electron plasma of pre-determined width, length, thickness, and location relative to a surface by passing an electron beam through a gas or gas mixture; and (b) controlling a radical and ion flux from the plasma to chemically and physically alter the surface of a substrate thereby improving the ability of a film to adhere to the substrate;

wherein the radical and ion flux from the plasma is controlled by selecting an appropriate gas mixture based on the desired surface pretreatment and by altering the separation between the plasma and the substrate.

20. The method of claim 19, wherein said electron beam has a width much larger in dimension than its thickness.

21. The method of claim 19, wherein the electron beam is confined by means of a magnetic field to produce a geometrically well-defined, spatially uniform plasma sheet.

22. The method of claim 19, wherein the relative position of said electron beam, plasma, and substrate is adjustable.

23. The method of claim 19, wherein said substrate is electrically biased.

24. The method of claim 19, wherein said gas or gas mixture comprises at least one molecular gas chosen to produce a specific radical species.

25. The method of claim 19, utilizing roll-to-roll spools to feed the substrate.

26. The method of claim 19, using a second gas or gas mixture with the electron beam generated plasma to sputter material from a target and deposit as a thin film or coating the sputtered material onto the pretreated substrate.

27. The method of claim 26, wherein said target is electrically biased above a sputtering threshold for said material source.

28. The method of claim 26, wherein said electron beam and plasma are located between the target and the substrate.

29. The method of claim 26, wherein the relative position of said electron beam, plasma, target, and substrate is adjustable.

30. The method of claim 26, wherein said second gas is selected from the group consisting of atomic or molecular gases or mixtures thereof.

31. The method of claim 26, using roll-to-roll spools to feed the substrate.

32. The method of claim 19, using a conventional plasma vapor deposition system for generating material for coating or deposition on the pretreated substrate, said material being generated from a material source by sputtering means or vaporization means.

33. The method of claim 32, wherein said sputtering means is selected from the group consisting of magnetrons and ion beams.

34. The method of claim 32, wherein, said vaporization means is selected from the group consisting of electron beams, lasers, and thermal sources.

35. The method of claim 32, wherein said plasma is located between said source material and said substrate.

36. The method of claim 32, wherein the relative position of said electron beam, plasma, source material, and substrate is adjustable.

* * * * *